(12) United States Patent
Hwu et al.

(10) Patent No.: US 11,757,025 B2
(45) Date of Patent: Sep. 12, 2023

(54) GATED METAL-INSULATOR-SEMICONDUCTOR (MIS) TUNNEL DIODE HAVING NEGATIVE TRANSCONDUCTANCE

(71) Applicants: Taiwan Semiconductor Manufacturing Co., Ltd., Hsinchu (TW); National Taiwan University, Taipei (TW)

(72) Inventors: Jenn-Gwo Hwu, Taipei (TW); Chien-Shun Liao, Hsinchu (TW)

(73) Assignees: Taiwan Semiconductor Manufacturing Co., Ltd., Hsinchu (TW); National Taiwan University, Taipei (TW)

(*) Notice: Subject to any disclaimer, the term of this patent is extended or adjusted under 35 U.S.C. 154(b) by 162 days.

(21) Appl. No.: 17/111,427

(22) Filed: Dec. 3, 2020

(65) Prior Publication Data

US 2021/0119025 A1 Apr. 22, 2021

Related U.S. Application Data

(63) Continuation of application No. 16/142,890, filed on Sep. 26, 2018, now Pat. No. 10,868,157.

(51) Int. Cl.
*H01L 29/739* (2006.01)
*H01L 29/51* (2006.01)
*H01L 29/45* (2006.01)
*H01L 29/49* (2006.01)
*H01L 29/06* (2006.01)
(Continued)

(52) U.S. Cl.
CPC .... *H01L 29/7391* (2013.01); *H01L 21/28088* (2013.01); *H01L 29/0649* (2013.01); *H01L 29/0684* (2013.01); *H01L 29/423* (2013.01); *H01L 29/45* (2013.01);
(Continued)

(58) Field of Classification Search
CPC ... H01L 29/88; H01L 29/402; H01L 29/7391; H01L 27/0814
See application file for complete search history.

(56) References Cited

U.S. PATENT DOCUMENTS 4,885,623 A 12/1989 Holm-Kennedy et al.
5,021,841 A 6/1991 Leburton et al.
(Continued)

OTHER PUBLICATIONS

Liao et al., "Energy-Saving Write/Read Operation of Memory Cell by Using Separated Storage Device and Remote Reading With an MIS Tunnel Diode Sensor," *IEEE Journal of the Electron Devices Society* 4(6):424-429, 2016.
(Continued)

*Primary Examiner* — John P. Dulka
(74) *Attorney, Agent, or Firm* — Seed IP Law Group LLP

(57) ABSTRACT

Gated MIS tunnel diode devices having a controllable negative transconductance behavior are provided. In some embodiments, a device includes a substrate, a tunnel diode dielectric layer on a surface of the substrate, and a gate dielectric layer on the surface of the substrate and adjacent to the tunnel diode dielectric layer. A tunnel diode electrode is disposed on the tunnel diode dielectric layer, and a gate electrode is disposed on the gate dielectric layer. A substrate electrode is disposed on the surface of the substrate, and the tunnel diode electrode is positioned between the gate electrode and the substrate electrode.

20 Claims, 11 Drawing Sheets

(51) Int. Cl.
H01L 21/28 (2006.01)
H01L 29/66 (2006.01)
H01L 29/423 (2006.01)
H01L 21/265 (2006.01)

(52) U.S. Cl.
CPC ........ *H01L 29/4966* (2013.01); *H01L 29/517* (2013.01); *H01L 29/66356* (2013.01); *H01L 21/26513* (2013.01)

(56) References Cited

U.S. PATENT DOCUMENTS

| | | | |
|---|---|---|---|
| 5,093,699 | A | 3/1992 | Weichold et al. |
| 6,208,559 | B1 | 3/2001 | Tu et al. |
| 7,030,434 | B1 | 4/2006 | Krautschneider et al. |
| 8,043,732 | B2* | 10/2011 | Anderson ............... H01L 43/08 365/158 |
| 2001/0054727 | A1 | 12/2001 | Hofmann et al. |
| 2003/0043630 | A1* | 3/2003 | Forbes .............. H01L 27/11556 365/185.26 |
| 2005/0067612 | A1 | 3/2005 | Busta et al. |
| 2008/0277720 | A1* | 11/2008 | Youn .................. H01L 29/7923 257/324 |
| 2010/0258852 | A1* | 10/2010 | Lim .................. H01L 27/11556 438/269 |
| 2010/0289005 | A1* | 11/2010 | Cowell, III ....... H01L 29/66272 257/29 |
| 2015/0005610 | A1 | 1/2015 | Zhang |
| 2015/0171076 | A1* | 6/2015 | Wernersson ............ H01L 29/78 136/255 |
| 2016/0093732 | A1* | 3/2016 | Lee .................. H01L 29/66666 257/329 |
| 2017/0222010 | A1* | 8/2017 | Weis ....................... H01L 29/45 |
| 2018/0090626 | A1 | 3/2018 | Yamashita |
| 2018/0358079 | A1 | 12/2018 | Jeon et al. |
| 2019/0103441 | A1* | 4/2019 | Hwu ........................ G11C 11/56 |
| 2019/0393350 | A1* | 12/2019 | Thompson ........ H01L 29/66439 |
| 2021/0202484 | A1* | 7/2021 | Hwu ....................... H10B 99/00 |

OTHER PUBLICATIONS

Liao et al., "Subthreshold Swing Reduction by Double Exponential Control Mechanism in an MOS Gated-MIS Tunnel Transistor," *IEEE Transactions on Electron Devices* 62(6):2061-2065, 2015.

Baek et al., "Mechanism of Negative Transconductance in Heterostructure Field-Effect Transistors," *IEEE Trans. Electron Devices* 37(8):1917-1921, 1990.

Chen et al., "A Novel Ultrafast Functional Device: Resonant Tunneling High Electron Mobility Transistor," in *Proc. IEEE Hong Kong Electron Devices Meet.*, Jun. 29, 1996, pp. 60-63.

Chen et al., "InGaAs/AlAs/InGaAsP Resonant Tunneling Bipolar Transistors Grown by Chemical Beam Epitaxy," in *Proc. IEEE/Cornell Conference on Advanced Concepts in High Speed Semiconductor Devices and Circuits*, Ithaca, NY, Aug. 2-4, 1993, pp. 290-298.

Cheng et al., "A Comprehensive Study of Bistable Gated Bipolar Device," *IEEE Trans. Electron Devices* 53(10):2589-2597, 2006.

Dağtekin et al., "Investigation of Partially Gated Si Tunnel FETs for Low Power Integrated Optical Sensing," in *44th European Solid State Device Research Conf.*, Venice, Italy, Sep. 22-26, 2014, pp. 190-193.

Esaki et al., "Superlattice and Negative Differential Conductivity in Semiconductors," *IBM J. Res. Develop.* 14(1):61-65, 1970.

Favaro et al., "Strained Layer AlGaAs—GaAs—InGaAs Real-Space Transferred Electron Devices," *Electronics Lett.* 26(16):1264-1265, 1990.

Gruzinskis et al., "Gunn Effect and THz Frequency Power Generation In $n^+$-n-$n^+$ GaN Structures", *Materials Science Forum* 297-298:341-344, 1999, (5 Pages).

Kim et al., "Field-Induced Interband Tunneling Effect Transistor (FITET) With Negative-Differential Transconductance and Negative-Differential Conductance," *IEEE Trans. Nanotech.* 4(3):317-321, 2005.

Lai et al., "The Observation of Negative Transconductance Effect Caused by Real-Space-Transfer of Electrons in Metal Oxide Semiconductor Field Effect Transistors Fabricated with $Ta_2O_5$ Gate Dielectric," *IEEE Electron Device Lett.* 22(3):142-144, 2001.

Lai et al., "Ultrahigh and Controllable Drain Current Peak-to-Valley Ratio in Negative Resistance Field-Effect Transistors with a Strained InGaAs Channel," *IEEE Electron Device Lett.* 15(9):333-335, 1994.

Lee et al., "Monolithic AlAs—InGaAs—InGaP—GaAs HRT-FETS With PVCR of 960 at 300 K," *IEEE Electron Device Lett.* 26(2):50-52, 2005.

Liao et al., "Remote Gate-Controlled Negative Transconductance in Gated MIS Tunnel Diode," *IEEE Transactions on Electron Devices* 63(7):2864-2870, 2016.

Mensz et al., "High transconductance and large peak-to-valley ratio of negative differential conductance in three-terminal InGaAs/InAlAs real-space transfer devices," *Appl. Phys. Lett.* 57(24):2558-2560, 1990.

Neamen, *Semiconductor Physics and Devices: Basic Principles*, 3rd ed., McGraw-Hill, New York, N.Y., 2003, Chap. 8.6., "The Tunnel Diode," pp. 313-316.

Nguyen et al., "Gate-controllable negative differential conductance in graphene tunneling transistors," *Semicond. Sci. Technol.* 27(10):105018, 2012. (8 Pages).

Ruden et al., "Distributive Nature of Gate Current and Negative Transconductance in Heterostructure Field-Effect Transistors," *IEEE Trans. Electron Devices* 36(2):453-456, 1989.

Tsai et al., "P—N Double Quantum Well Resonant Interband Tunneling Diode with Peak-To-Valley Current Ratio of 144 at Room Temperature," *IEEE Electron Device Lett.* 15(9):357-359, 1994.

Versari et al., "MOSFET's Negative Transconductance at Room Temperature," *IEEE Trans. Electron Devices* 46(6):1189-1195, 1999.

Wu et al., "A Novel δ-Doped GaAs/InGaAs Real-Space Transfer Transistor with High Peak-to-Valley Ratio and High Current Driving Capability," *IEEE Electron Device Lett.* 16(3):112-114, 1995.

Wu et al., "Novel SiC/Si Heterostructure Negative-Differential-Resistance Diode for Use as Switch with High On/Off Current Ratio and Low Power Dissipation," *IEEE Electron Device Lett.* 19(8):294-296, 1998.

* cited by examiner

GATED METAL-INSULATOR-SEMICONDUCTOR (MIS) TUNNEL DIODE HAVING NEGATIVE TRANSCONDUCTANCE

BACKGROUND

Semiconductor devices that exhibit negative transconductance over at least some operating regions may be referred to as negative transconductance devices. Some examples of negative transconductance devices include tunnel diodes, tunneling field effect transistors (TFET), and resonant-tunneling transistors.

Conventional negative transconductance devices generally have a relatively low peak-to-valley current ratio (PVCR). The limited PVCR of such negative transconductance devices may limit the usefulness of conventional negative transconductance devices in a variety of applications.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
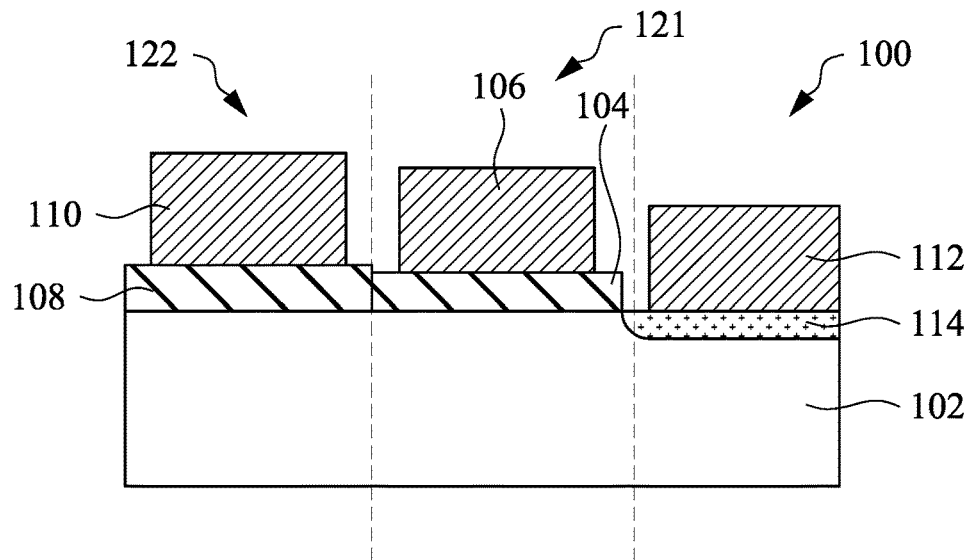
FIG. 1 is a cross-sectional view illustrating a gated MIS-tunnel diode device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to deposition techniques for depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to etching techniques for selective removal of dielectric materials, metals, or any other materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described.

The fin structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structure.

FIG. 1 is a cross-sectional view illustrating a device 100 in accordance with one or more embodiments of the present disclosure.

The device 100 is a gated MIS-tunnel diode, which has a negative transconductance property when the gate electrode 110 is biased from an inversion region to a flat-band region, as will be described in further detail below.

The device 100 includes a substrate 102, which may be a substrate of any semiconductor material. In some embodiments, the substrate 102 is a silicon substrate; however, embodiments provided herein are not limited thereto. For example, in various embodiments, the substrate 102 may include gallium arsenide (GaAs), gallium nitride (GaN), silicon carbide (SiC), or any other semiconductor material. The substrate 102 may include various doping configurations depending on design specifications. In some embodiments, the substrate 102 is a p-type substrate having a concentration of p-type dopants. In other embodiments, the substrate 102 is a n-type substrate having a concentration of n-type dopants. The substrate 102 includes a doped region 114 that is doped with dopants of the same conductivity type as the substrate 102. For example, in embodiments where the substrate 102 is a p-type substrate, the doped region 114 includes p-type dopants, and in embodiments where the substrate 102 is a n-type substrate, the doped region 114 includes n-type dopants. The doped region 114 has a higher concentration of the dopants (whether p-type or n-type) than the surrounding portions (e.g., a bulk region) of the substrate 102. In some embodiments where the substrate 102 is an n-type substrate, the dopant concentration of the substrate 102 may be within a range from $n_i$ to $0.01*N_c$, inclusive, where $n_i$ is the intrinsic carrier concentration of the substrate 102 and $N_c$ is the effective density of states in the conduction band. In some embodiments where the substrate 102 is a p-type substrate, the dopant concentration of the substrate 102 may be within a range from $n_i$ to $0.01*1N_v$, inclusive, where $N_v$ is the effective density of states in the valence band. In some embodiments where the substrate 102 is an n-type substrate, the dopant concentration of the doped region 114 may be within a range from $0.01*N_c$ to $1*N_c$, inclusive, and in some embodiments where the substrate 102 is a p-type substrate, the dopant concentration of the doped region 114 may be within a range from $0.01*N_v$ to $1*N_v$, inclusive.

A tunnel diode dielectric layer 104 is disposed on a surface (e.g., upper surface as shown in FIG. 1) of the substrate 102, and a tunnel diode electrode 106 is disposed on the tunnel diode dielectric layer 104. In some embodiments, the tunnel diode dielectric layer 104 is an oxide layer, such as silicon dioxide ($SiO_2$) or hafnium dioxide ($HfO_2$). In some embodiments, the tunnel diode dielectric layer 104 may be a multi-layer structure such as a layered stack of $SiO_2$ and $HfO_2$. The tunnel diode electrode 106 may be formed of any material suitable for use as an electrode, and may be, for example, a metal electrode. The material used for the tunnel diode electrode 106 may be selected so that the majority carriers will encounter a Schottky barrier while tunneling through the tunnel diode dielectric layer 104 from the tunnel diode electrode 106 to the substrate 102. In some embodiments, the tunnel diode electrode 106 is formed of a material having a Schottky barrier height that is large enough that it can be significantly modulated by the tunnel diode dielectric layer 104 voltage (e.g., the voltage across the tunnel diode dielectric layer 104), as will be discussed in further detail later herein. In various embodiments, the tunnel diode electrode 106 may include one or more of aluminum (Al), tantalum nitride (TaN), and titanium aluminide (TiAl). In some embodiments, the tunnel diode electrode 106 may be a multi-layer structure such as a layered stack of TaN, TiAl, and Al.

The tunnel diode dielectric layer has a thickness (e.g., between the substrate 102 and the tunnel diode electrode 106) that is suitable for quantum tunneling through the tunnel diode dielectric layer 104. In some embodiments, the thickness of the tunnel diode dielectric layer 104 may be less than 10 nm. In some embodiments, the thickness of the tunnel diode dielectric layer 104 is less than 4 nm.

A gate dielectric layer 108 is disposed on the surface of the substrate 102 adjacent to the tunnel diode dielectric layer 104. In some embodiments, the gate dielectric layer 108 may contact the tunnel diode dielectric layer 104, for example, with side surfaces of the gate dielectric layer 108 and the tunnel diode dielectric layer 104 being in contact with one another. The gate dielectric layer 108 may be an oxide layer, such as silicon dioxide ($SiO_2$) or hafnium dioxide ($HfO_2$). In some embodiments, the gate dielectric layer 108 may be a multi-layer structure such as a layered stack of $SiO_2$ and $HiO_2$. The gate dielectric layer 108 may have a thickness (e.g., between the substrate 102 and the gate electrode 110) that is greater than the thickness of the tunnel diode dielectric layer 104. In some embodiments, the gate dielectric layer 108 may have a thickness that is greater than 4 nm, and in some embodiments, the gate dielectric layer 108 may be a thickness that is greater than 10 nm. In some embodiments, the tunnel diode dielectric layer 104 and the gate dielectric layer 108 may have a same thickness.

The gate electrode 110 is disposed on the gate dielectric layer 108 and is spaced apart from the tunnel diode electrode 106 by a distance that is small enough that the voltage drop across the tunnel diode dielectric layer 104 can be modulated by the variation of minority carrier concentration induced by a gate bias (i.e., by a voltage applied to the gate electrode 110). In some embodiments, the gate electrode 110 is spaced apart from the tunnel diode electrode 106 by a distance that is less than 10 μm. In some embodiments, the gate electrode 110 is spaced apart from the tunnel diode electrode 106 by a distance that is less than 100 nm.

The gate electrode 110 may be formed of any material suitable for use as an electrode, and may be, for example, a metal electrode. In various embodiments, the gate electrode 110 may include one or more of aluminum (Al), tantalum nitride (TaN), and titanium aluminide (TiAl). In some embodiments, the gate electrode 110 may be a multi-layer structure such as a layered stack of TaN, TiAl, and Al. In some embodiments, the gate electrode 110 and the tunnel diode electrode 106 may be formed of the same material or materials.

The device 100 further includes a substrate electrode 112, which is provided on the doped region 114 of the substrate 102. The substrate electrode 112 is spaced apart from the tunnel diode electrode 106, with the tunnel diode electrode 106 positioned between the gate electrode 110 and the substrate electrode 112. The substrate electrode 112 may be formed of any suitable material, and may be, for example, a metal electrode. In some embodiments, the substrate electrode 112 may include one or more of aluminum (Al), tantalum nitride (TaN), and titanium aluminide (TiAl). In some embodiments, the substrate electrode 112 may be a multi-layer structure such as a layered stack of TaN, TiAl, and Al.

As mentioned previously herein, the device 100 is a gated MIS-tunnel diode. The device 100 may be considered as including two separate tunnel diodes. For example, the device 100 includes a first tunnel diode 121 (which may be referred to as a sensing tunnel diode) that includes the tunnel diode electrode 106, the tunnel diode dielectric layer 104 and underlying portions of the substrate 102. The device 100 further includes a second tunnel diode 122 (which may be referred to as a control tunnel diode) adjacent to the first tunnel diode 121 and which includes the gate electrode 110, the gate dielectric layer 108 and underlying portions of the substrate 102.

The saturation current of the first tunnel diode 121 is exponentially dependent on the effective Schottky barrier height. The effective Schottky barrier height is linear with respect to the tunnel diode dielectric layer 104 voltage (e.g., the voltage across the tunnel diode dielectric layer 104). The tunnel diode dielectric layer 104 voltage, in turn, can be changed by the substrate surface electron concentration, which can be modulated by a bias applied to the gate electrode 110 of the second tunnel diode 122. Accordingly, while biasing the gate electrode 110 from an inversion region to a flat band region, the electron concentration decreases and the saturation current of the first tunnel diode 121 dramatically decreases, which results in negative transconductance of the first tunnel diode 121.

During operation, a voltage applied to the tunnel diode electrode 106 causes majority charge carriers (e.g., holes) to tunnel through the tunnel diode dielectric layer 104 with a majority carrier current $I_h$. The negative transconductance of the first tunnel diode 121 is controlled by a voltage applied to the gate electrode 110 of the second tunnel diode 122. The behavior of the first tunnel diode 121 with two different voltages applied to the gate electrode 110 will now be described in further detail below.

In a first case, when a voltage $V_G$ applied to the gate electrode 110 is greater than the flat band voltage $V_{FB}$ (i.e., $V_G > V_{FB}$), the minority carrier (e.g., electrons) concentration, $n_e$, under the gate electrode 110 is increased. The electron flux, $F_e$, toward the first tunnel diode 121 is therefore also increased. Hence, the inversion level of the first tunnel diode 121 increases, which in turn increases the tunnel diode dielectric layer 104 voltage (which may be referred to as the tunnel oxide voltage $V_{ox}$). The increase in the tunnel oxide voltage $V_{ox}$ causes a decrease in the effective Schottky barrier height $\phi^*_h$ of the first tunnel diode 121. The majority carrier current $(I_h)$ increases exponentially with decreasing $\phi^*_h$, i.e., $I_h \propto \exp(-q\phi^*_h/kT)$. The saturation current of the first tunnel diode 121, $I_{TD,sat}$ is dominated by the majority carrier current $I_h$, i.e., $I_{TD,sat} \approx I_h$.

In a second case, when the voltage $V_G$ applied to the gate electrode 110 is equal to the flat band voltage $V_{FB}$ ($V_G = V_{FB}$), the minority carrier concentration $n_e$ is decreased. Hence, the saturation current of the first tunnel diode 121 $I_{TD,sat}$ is decreased. The saturation current of the first tunnel diode 121 in the first case (i.e., $I_{TD,sat}$ ($V_G > V_{FB}$)) is significantly larger than in the second case (i.e., $I_{TD,sat}$ ($V_G = V_{FB}$)), which results in the negative transconductance behavior of the device 100.

Accordingly, voltages applied to the gate electrode 110 of the control tunnel diode 122 can modulate the Schottky barrier height by controlling minority carrier concentration $n_e$ and thereby controlling the tunnel oxide voltage $V_{ox}$.

The negative transconductance behavior of device 100 depends, at least in part, on the thickness $(d_{ox})$ of the tunnel diode dielectric layer 104. More particularly, when $V_G > V_{FB}$, the minority carrier concentration $n_e$ is dominated by the inversion charge concentration $n_{inv}$. The inversion charge concentration $n_{inv}$ increases with an increase in the tunnel diode dielectric layer 104 thickness $d_{ox}$, since the tunneling rate is decreased with a thicker dielectric layer and more inversion charges are held at the surface of the substrate 102. Accordingly, the peak current $I_{peak}$ of the first tunnel diode 121 increases with an increase in the thickness $d_{ox}$ of the tunnel diode dielectric layer 104.

On the other hand, when $V_G < V_{FB}$, the minority carrier concentration $n_e$ is dominated by the electron concentration due to gate injection $n_{inj}$, which decreases with an increase in the tunnel diode dielectric layer 104 thickness $d_{ox}$, since the tunneling rate is decreased with a thicker dielectric layer. Accordingly, the valley $I_{valley}$ of the tunneling current of the first tunnel diode 121 decreases with an increase in the thickness $d_{ox}$ of the tunnel diode dielectric layer 104. Since the peak $I_{peak}$ of the tunneling current increases and the valley $I_{valley}$ of the tunneling current decreases with an increase in the thickness $d_{ox}$ of the tunnel diode dielectric layer 104, the peak-to-valley current ratio (PVCR) also increases with an increase in the thickness $d_{ox}$ of the tunnel diode dielectric layer 104. More particularly, in some embodiments, the PVCR increases from 1 order of magnitude to 6 orders of magnitude as the thickness $d_{ox}$ of the tunnel diode dielectric layer 104 is increased from 2.2 nm to 3.3 nm. For example, in some embodiments, the PVCR has a value of about $1 \times 10^1$ when the thickness $d_{ox}$ of the tunnel diode dielectric layer 104 is 2.2 nm, and the PVCR has a value of about $1.3 \times 10^6$ when the thickness $d_{ox}$ of the tunnel diode dielectric layer 104 is 3.3 nm. In some embodiments, the thickness $d_{ox}$ of the tunnel diode dielectric layer 104 may be within a range from 2 nm to 4 nm, inclusive.

FIGS. 2A to 2H are cross-sectional views illustrating a method of forming a gated MIS-tunnel diode device, such as the device 100, in some embodiments.

Figure 2A:
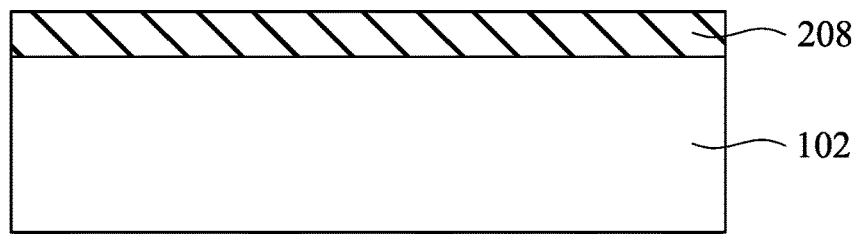
FIGS. 2A to 2H are cross-sectional views illustrating a method of forming a gated MIS-tunnel diode device, in accordance with some embodiments.

As shown in FIG. 2A, a first dielectric layer 208 is formed on a substrate 102. In some embodiments, the substrate 102 is a silicon substrate; however, embodiments provided herein are not limited thereto. For example, in various embodiments, the substrate 102 may include gallium arsenide (GaAs), gallium nitride (GaN), silicon carbide (SiC), or any other semiconductor material. In some embodiments, the substrate 102 is a p-type substrate having a concentration of p-type dopants, and in other embodiments the substrate 102 is a n-type substrate having a concentration of n-type dopants.

In some embodiments, the first dielectric layer 208 is an oxide layer, such as silicon dioxide ($SiO_2$) or hafnium dioxide ($HfO_2$). In some embodiments, the first dielectric layer 208 is a multi-layer structure such as a layered stack of $SiO_2$ and $HfO_2$. The first dielectric layer 208 may be formed by any suitable process, including, for example, deposition, anodization, thermal oxidation, or the like. In some embodiments, the first dielectric layer 208 is formed by a deposition process. The deposition process may be any suitable deposition process for depositing a dielectric layer, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

Figure 2B:
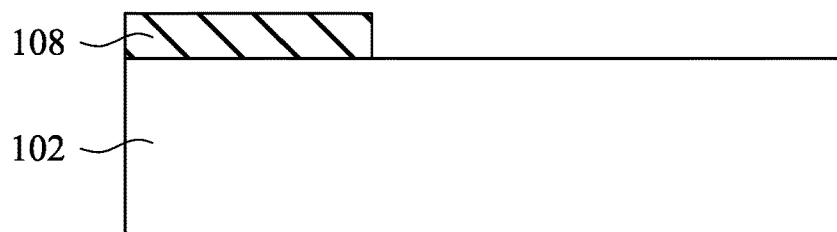

As shown in FIG. 2B, the gate dielectric layer 108 is formed by removing portions of the first dielectric layer 208. The portions of the first dielectric layer 208 may be removed by any suitable process, including, for example, by an etching process. In some embodiments, a mask is formed over the first dielectric layer 208 and exposes portions of the first dielectric layer 208 that will be removed. An etchant may then be utilized to remove the exposed portions of the first dielectric layer 208. Any suitable etchant may be utilized, including, for example, any suitable dry etchant or wet etchant such as hydrofluoric acid. The mask may then be removed, leaving the gate dielectric layer 108 on the substrate 102.

Figure 2C:
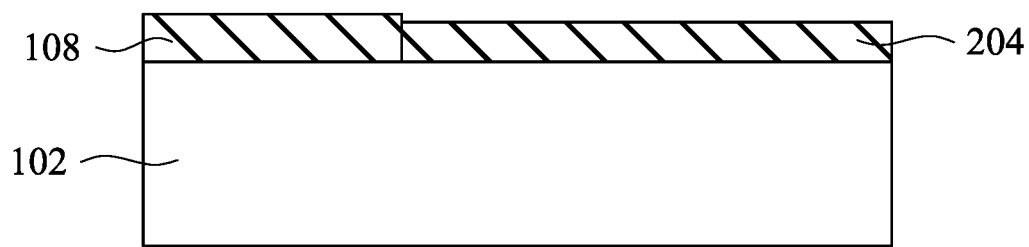

As shown in FIG. 2C, a second dielectric layer 204 is formed on the substrate 102 adjacent to the gate dielectric layer 108. In some embodiments, the second dielectric layer 204 is an oxide layer, such as silicon dioxide ($SiO_2$) or hafnium dioxide ($HfO_2$). In some embodiments, the second dielectric layer 204 is a multi-layer structure such as a layered stack of $SiO_2$ and $HfO_2$. In some embodiments, the second dielectric layer 204 is formed of a same material as the first dielectric layer 208.

The second dielectric layer 204 may be formed by any suitable process, including, for example, deposition, anodization, thermal oxidation, or the like. In some embodiments, the second dielectric layer 204 may be formed by a deposition process, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

In some embodiments, the second dielectric layer 204 has a thickness that is less than a thickness of the gate dielectric layer 108, as shown in FIG. 2C. In some embodiments, the second dielectric layer 204 may have a thickness that is less than 10 nm, and in some embodiments, the second dielectric layer 204 may have a thickness that is less than 4 nm. In some embodiments, the tunnel diode dielectric layer 104 and the gate dielectric layer 108 may have a same thickness.

In some embodiments, the second dielectric layer 204 contacts the gate dielectric layer 108, for example, at side surfaces of the gate dielectric layer 108 and the second dielectric layer 204.

Figure 2D:
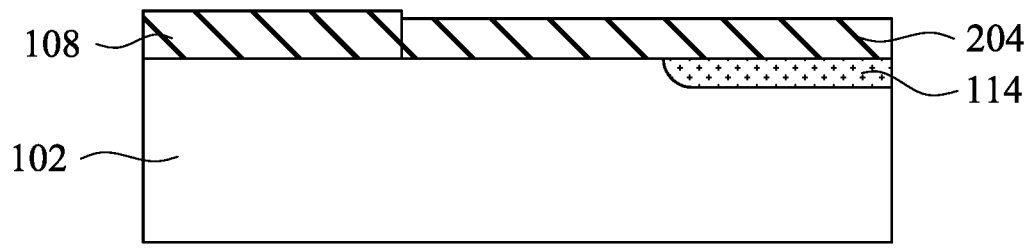

As shown in FIG. 2D, a doped region 114 is formed in the substrate 102. In some embodiments, the doped region 114 is formed by an implantation process in which a dopant species is implanted into the substrate 102. The implanted dopants may have a same conductivity type as the substrate 102. For example, in embodiments where the substrate 102 is a p-type substrate, the doped region 114 includes p-type dopants, and in embodiments where the substrate 102 is a n-type substrate, the doped region 114 includes n-type dopants. The doped region 114 has a higher concentration of the dopants (whether p-type or n-type) than the surrounding portions of the substrate 102. In some embodiments where the substrate 102 is an n-type substrate, the dopant concentration of the substrate 102 may be within a range from $n_i$ to $0.01*N_c$, inclusive, where $n_i$ is the intrinsic carrier concentration of the substrate 102 and $N_c$ is the effective density of states in the conduction band. In some embodiments where the substrate 102 is a p-type substrate, the dopant concentration of the substrate 102 may be within a range from $n_i$ to $0.01*N_v$, inclusive, where $N_v$ is the effective density of states in the valence band. In some embodiments where the substrate 102 is an n-type substrate, the dopant concentration of the doped region 114 may be within a range from $0.01*N_c$ to $1*N_c$, inclusive, and in some embodiments where the substrate 102 is a p-type substrate, the dopant concentration of the doped region 114 may be within a range from $0.01*N_v$ to $1*N_v$, inclusive.

Figure 2E:
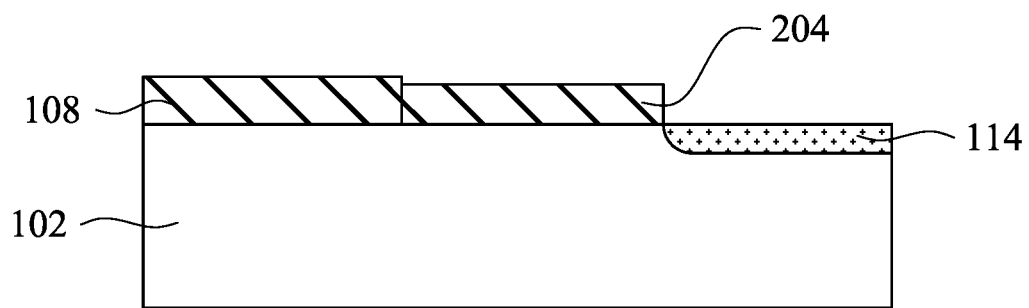
Figure 2F:
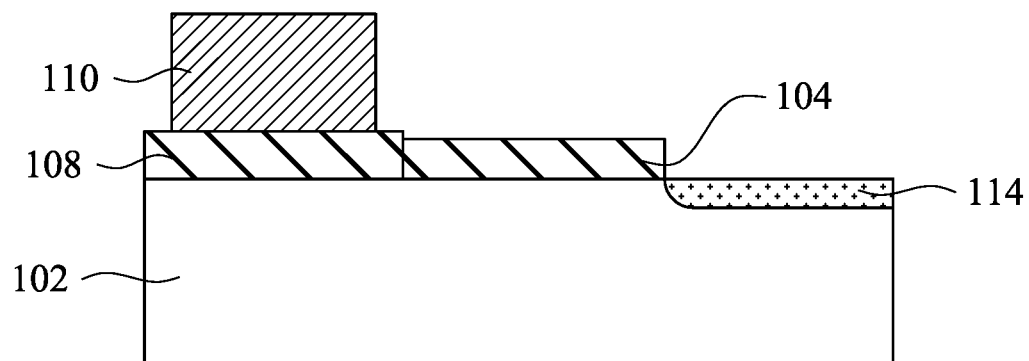
Figure 2G:
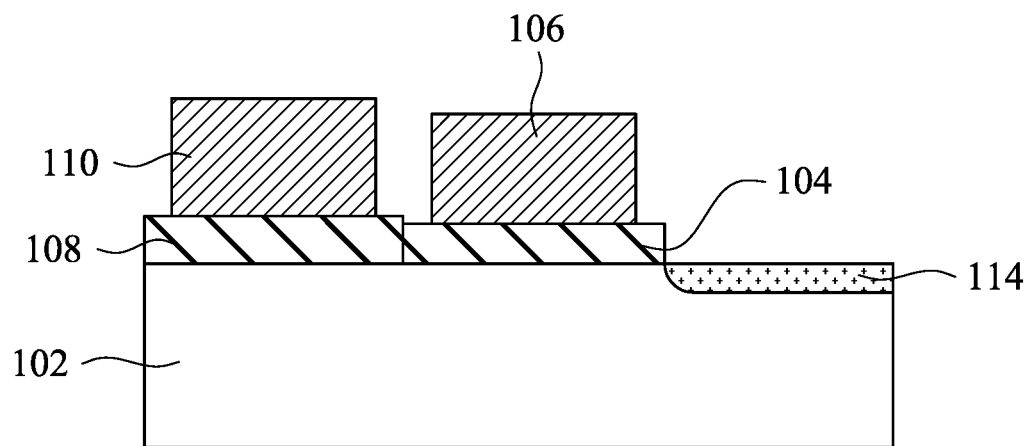
Figure 2H:
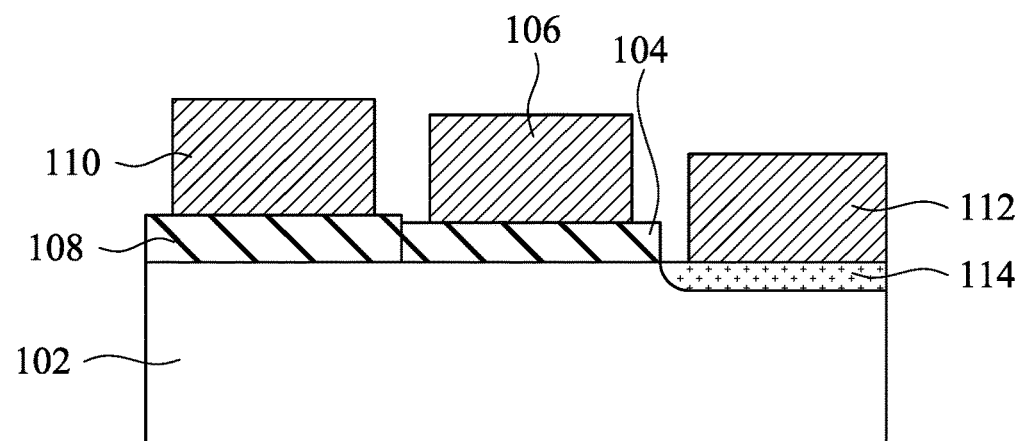

The doped region 114 has a width (e.g., along the horizontal direction as shown in FIG. 2D) that overlaps with the substrate electrode 112 (FIG. 2H). In some embodiments, the doped region 114 does not overlap with the tunnel diode electrode 106 or any other neighboring electrodes. In some embodiments, the depth of the doped region 114 may be within a range from several hundreds of micrometers to several nanometers, inclusive. In some embodiments, the doped region 114 may be omitted, for example, if the contact between the substrate electrode 112 and the substrate 102 is ohmic.

In some embodiments, the dopants may be implanted into the doped region 114 through the second dielectric layer 204. In other embodiments, the dopants may be implanted into the doped region 114 after portions of the second dielectric layer 204 have been removed to form the tunnel diode dielectric layer 104 (FIG. 2E). The dopants may be implanted through a mask which exposes portions of the second dielectric layer 204 and/or the substrate 102 through which the dopants are implanted.

As shown in FIG. 2E, the tunnel diode dielectric layer 104 is formed by removing portions of the second dielectric layer 204, for example, by an etching process. In some embodiments, a mask is formed over the second dielectric layer 204 and exposes portions of the second dielectric layer 204 that will be removed. An etchant may then be utilized to remove the exposed portions of the second dielectric layer 204. Any suitable etchant may be utilized, including, for example, any suitable dry etchant or wet etchant such as hydrofluoric acid. The mask may then be removed, leaving the tunnel diode dielectric layer 104 on the substrate 102. The tunnel diode dielectric layer 104 may have a thickness that is less than a thickness of the gate dielectric layer 108, as shown. In some embodiments, the thickness of the tunnel diode dielectric layer 104 may be less than 10 nm. In some embodiments, the thickness of the tunnel diode dielectric layer 104 is less than 4 nm. In some embodiments, the thickness of the tunnel diode dielectric layer 104 is within a range from 2 nm to 4 nm, inclusive.

As shown in FIG. 2F, a gate electrode 110 is formed on the gate dielectric layer 108. The gate electrode 110 may be formed of any material suitable for use as an electrode, and may be, for example, a metal. The gate electrode 110 may be formed by depositing one or more of aluminum (Al), tantalum nitride (TaN), and titanium aluminide (TiAl) on the gate dielectric layer 108 and patterning the deposited materials to form the gate electrode 110. In some embodiments, the gate electrode 110 may be formed as a multi-layer structure such as a layered stack of TaN, TiAl, and Al. Such a multi-layer structure may be formed by deposition of TaN, TiAl, and Al, in any order or sequence.

In some embodiments, the gate electrode 110 is formed to have to have a width that is less than a width of the gate dielectric layer 108. That is, as shown in FIG. 2F, portions of the gate dielectric layer 108 may extend laterally beyond opposite side surfaces of the gate electrode 110.

As shown in FIG. 2G, a tunnel diode electrode 106 is formed on the tunnel diode dielectric layer 104. The tunnel diode electrode 106 may be formed of any material suitable for use as an electrode, and may be, for example, a metal. The tunnel diode electrode 106 may be formed by depositing one or more of aluminum (Al), tantalum nitride (TaN), and titanium aluminide (TiAl) on the tunnel diode dielectric layer 104 and patterning the deposited material to form the tunnel diode electrode 106. In some embodiments, the tunnel diode electrode 106 may be formed as a multi-layer structure such as a layered stack of TaN, TiAl, and Al. Such a multi-layer structure may be formed by deposition of TaN, TiAl, and Al, in any order or sequence. In some embodiments, the gate electrode 110 and the tunnel diode electrode 106 may be formed by a same process, e.g., by deposition and patterning of the gate electrode 110 and the tunnel diode electrode 106.

The tunnel diode electrode 106 is formed to be spaced apart laterally from the gate electrode 110. In some embodiments, the tunnel diode electrode 106 is spaced apart from the gate electrode 110 by distance that is less than 10 μm. In some embodiments, the tunnel diode electrode 106 is spaced apart from the gate electrode 110 by a distance that is less than 100 nm.

As shown in FIG. 2H, a substrate electrode 112 is formed on the doped region 114. The substrate electrode 112 may be formed of any material suitable for use as an electrode, and may be, for example, a metal. The substrate electrode 112 may be formed, for example, by depositing one or more of aluminum (Al), tantalum nitride (TaN), and titanium aluminide (TiAl) on the doped region 114 and patterning the deposited materials to form the substrate electrode 112. In some embodiments, the substrate electrode 112 may be formed as a multi-layer structure such as a layered stack of TaN, TiAl, and Al. Such a multi-layer structure may be formed by deposition of TaN, TiAl, and Al, in any order or sequence.

The substrate electrode 112 is spaced apart from the tunnel diode electrode 106, with the tunnel diode electrode 106 positioned between the gate electrode 110 and the substrate electrode 112.

Figure 3:
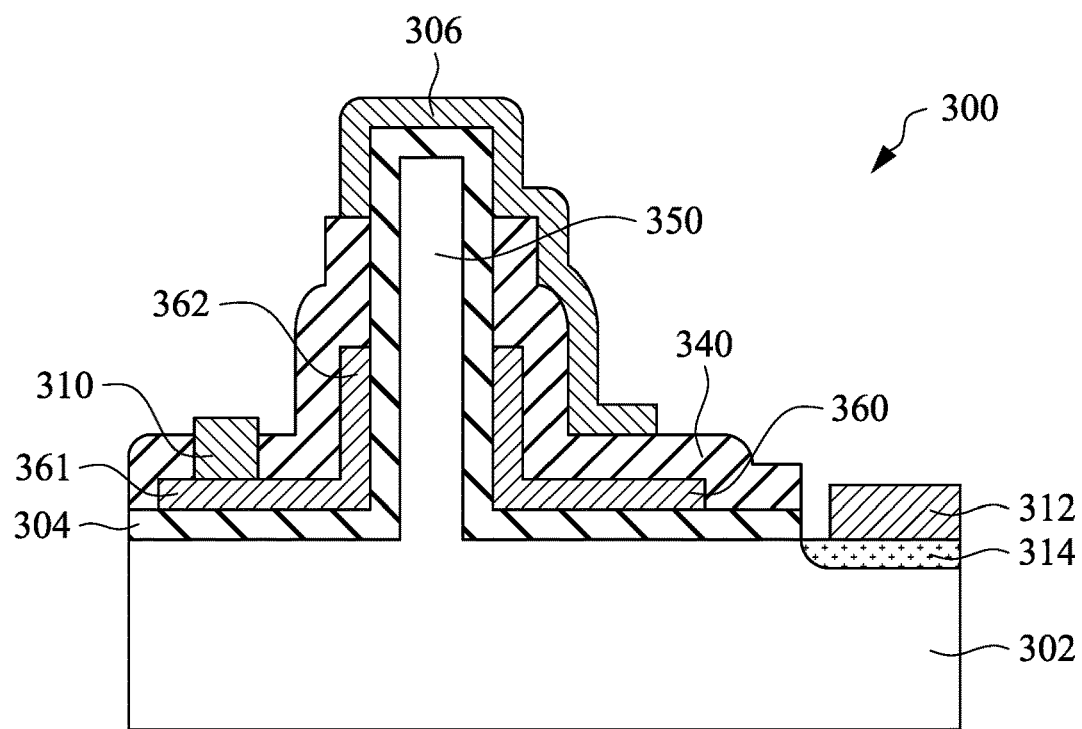
FIG. 3 is a cross-sectional view illustrating a gated MIS-tunnel diode device having a vertical or fin structure, in accordance with some embodiments.

FIG. 3 is a cross-sectional view illustrating a device 300 in accordance with one or more embodiments of the present disclosure. Similar to the device 100 shown in FIG. 1, the device 300 is a gated MIS-tunnel diode which has a negative transconductance property when a gate electrode is biased from an inversion region to a flat-band region. However, the device 300 has a different structure than the device 100 of FIG. 1. More specifically, the device 300 is a gated MIS-tunnel diode having a vertical or fin structure.

The device 300 includes a substrate 302, which may be a substrate of any semiconductor material. In some embodiments, the substrate 302 is a silicon substrate; however, embodiments provided herein are not limited thereto. In some embodiments, the substrate 302 is a p-type substrate having a concentration of p-type dopants. In other embodiments, the substrate 302 is a n-type substrate having a concentration of n-type dopants. A doped region 314 is formed in the substrate 302, and in some embodiments the doped region 314 is doped with dopants of the same conductivity type as the substrate 102. The doped region 314 has a higher concentration of the dopants (whether p-type or n-type) than the surrounding portions of the substrate 302.

A semiconductor fin 350 extends outwardly from a surface (e.g., an upper surface, as shown in FIG. 3) of the substrate 302. The fin 350 may be formed of the same material, and may have a same conductivity type, as the substrate 302. In some embodiments, the fin 350 is an extension or protruding portion of the substrate 302.

A first dielectric layer 304 is disposed on a surface of the substrate 302 and covers the fin 350. In some embodiments, the first dielectric layer 304 may surround the fin 350, with the first dielectric layer 304 covering side surfaces and an upper surface of the fin 350. In some embodiments, the first dielectric layer 304 is an oxide layer, such as silicon dioxide (SiO$_2$) or hafnium dioxide (HfO$_2$). In some embodiments, the first dielectric layer 304 may be a multi-layer structure such as a layered stack of SiO$_2$ and HfO$_2$. In some embodiments, the thickness of the first dielectric layer 304 may be less than 10 nm. In some embodiments, the thickness of the first dielectric layer 304 is less than 4 nm.

A metal layer 360 is disposed on the first dielectric layer 304. The metal layer 360 includes a first portion 361 that extends in a first direction (e.g., a horizontal direction as shown in FIG. 3) and a second portion 362 that extends in a second direction (e.g., a vertical direction as shown in FIG. 3) that is transverse to the first direction. The second portion 362 of the metal layer 360 may completely surround sides of a portion of the fin 350. For example, in some embodiments, the second portion 362 of the metal layer 360 surrounds sides of a lower portion of the fin 350, i.e., between an upper surface of the second portion 362 of the metal layer 360 and an upper surface of the substrate 302 from which the fin 350 extends. The second portion 362 of metal layer 360 has an upper surface that is below an upper surface of the fin 350. The metal layer 360 may be formed of any suitable metal. In some embodiments, the metal layer 360 may include one or more of aluminum (Al), tantalum nitride (TaN), and titanium aluminide (TiAl). In some embodiments, the metal layer 360 may be a multi-layer structure such as a layered stack of TaN, TiAl, and Al.

A gate electrode 310 is disposed on the metal layer 360. In some embodiments, the gate electrode 310 is disposed on the first portion 361 of the metal layer 360, and is spaced apart laterally from the second portion 362 of the metal layer 360. The gate electrode 310 may be formed of any material suitable for use as an electrode, and may be, for example, a metal electrode. In various embodiments, the gate electrode 310 may include one or more of aluminum (Al), tantalum nitride (TaN), and titanium aluminide (TiAl). In some embodiments, the gate electrode 310 may be a multi-layer structure such as a layered stack of TaN, TiAl, and Al.

An isolation dielectric layer 340 is disposed on the metal layer 360. In some embodiments, the isolation dielectric layer 340 abuts side surfaces of the gate electrode 310. The isolation dielectric layer 340 may extend over a first edge of the first portion 361 of the metal layer 360, e.g., beyond the left edge of the metal layer 360, as shown in FIG. 3, and may contact the first dielectric layer 304. In some embodiments, the isolation dielectric layer 340 extends laterally to a second edge of the first portion 361 of the metal layer 360, e.g., the right edge of the metal layer 360 shown in FIG. 3.

The isolation dielectric layer 340 extends in the second direction (e.g., the vertical direction shown in FIG. 3) over the second portion 362 of the metal layer 360. In some embodiments, the isolation dielectric layer 340 covers an upper surface of the second portion 362 of the metal layer 360 and is in contact with the first dielectric layer 304 along a length of a portion of the fin 350 that extends along the second direction beyond an upper surface of the second portion 362 of the metal layer 360. The isolation dielectric layer 340 may be any suitable dielectric material, and in some embodiments the isolation dielectric layer 340 may be an oxide.

A tunnel diode electrode 306 is disposed on the first dielectric layer 304 over the upper surface of the fin 350. In some embodiments, the tunnel diode electrode 306 contacts the upper surface of the isolation dielectric layer 340 and extends along the second direction (e.g., the vertical direction shown in FIG. 3) and over the first dielectric layer 304 on the upper surface of the fin 350. The tunnel diode electrode 306 may be spaced apart from the metal layer 360 by the isolation dielectric 340.

The tunnel diode electrode 306 may be formed of any material suitable for use as an electrode, and may be, for example, a metal electrode. In various embodiments, the tunnel diode electrode 306 may include one or more of aluminum (Al), tantalum nitride (TaN), and titanium aluminide (TiAl). In some embodiments, the tunnel diode electrode 306 may be a multi-layer structure such as a layered stack of TaN, TiAl, and Al. In some embodiments, the tunnel diode electrode 306 and the gate electrode 310 may be formed of the same material or materials.

A substrate electrode 312 is disposed on the doped region 314 of the substrate 302. The substrate electrode 312 is spaced apart from the metal layer 360, and in some embodiments, the substrate electrode 312 is positioned opposite the gate electrode 310, with the fin 350 and tunnel diode electrode 306 positioned between the substrate electrode 312 and the gate electrode 310. In some embodiments, portions of the first dielectric layer 304 and the isolation dielectric layer 340 extend between the doped region 314 and a side edge of the metal layer 360.

The substrate electrode 312 may be formed of any suitable material, and may be, for example, a metal electrode. In some embodiments, the substrate electrode 312 may include one or more of aluminum (Al), tantalum nitride (TaN), and titanium aluminide (TiAl). In some embodiments, the substrate electrode 312 may be a multi-layer structure such as a layered stack of TaN, TiAl, and Al.

The device 300 operates in a substantially similar manner as described above with respect to the device 100. A first portion of the first dielectric layer 304 between the fin 350 and the tunnel diode electrode 306 may correspond to the tunnel diode dielectric layer 104 of the device 100, and a second portion of the first dielectric layer 304 between the metal layer 360 and the substrate 302 may correspond to the gate dielectric layer 108 of the device 100.

During operation of the device 300, a voltage applied to the tunnel diode electrode 306 causes majority charge carriers (e.g., holes) to tunnel through the first portion of the first dielectric layer 304 (i.e., the portion between the tunnel diode electrode 306 and the fin 350) with a majority carrier current $I_h$. The negative transconductance of the device 300 may be controlled by a voltage applied to the metal layer 360 via the gate electrode 310.

FIGS. 4A to 4E are cross-sectional views illustrating a method of forming a gated MIS-tunnel diode device, such as the device 300, in some embodiments.

Figure 4A:
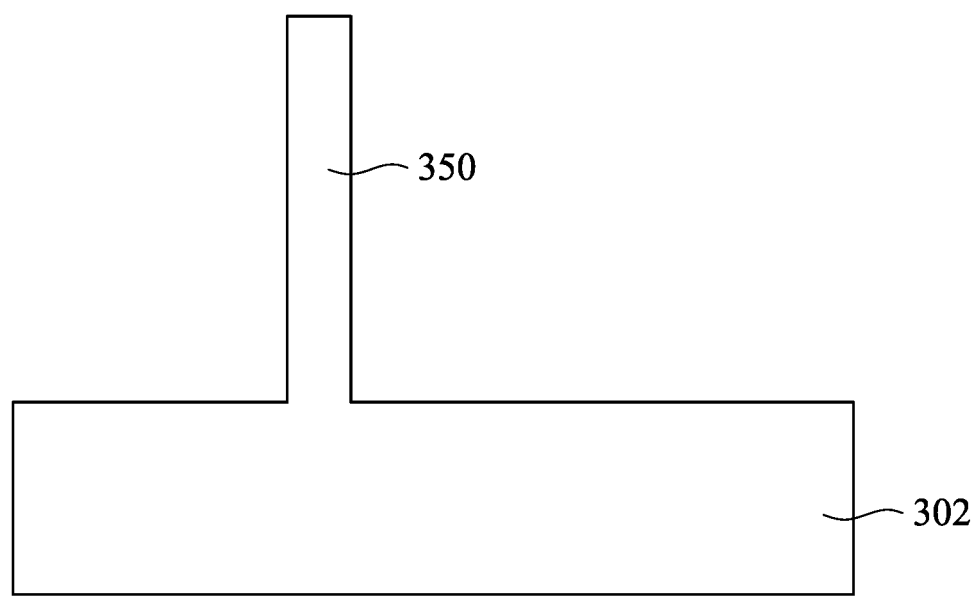
FIGS. 4A to 4E are cross-sectional views illustrating a method of forming a gated MIS-tunnel diode device, in accordance with some embodiments.

As shown in FIG. 4A, a fin 350 is formed on a substrate 302. In some embodiments, the fin 350 may be a part of the substrate 302, and may be formed by selectively etching the substrate 302. For example, a mask may be formed over a portion of the substrate 302 which will become the fin 350, and the surrounding portions may be exposed to an etchant that etches into the substrate 302 to form recessed surfaces surrounding the fin 350. The fin 350 may extend outwardly (e.g., in the vertical direction as shown) from the recessed surface of the substrate 302.

Figure 4B:
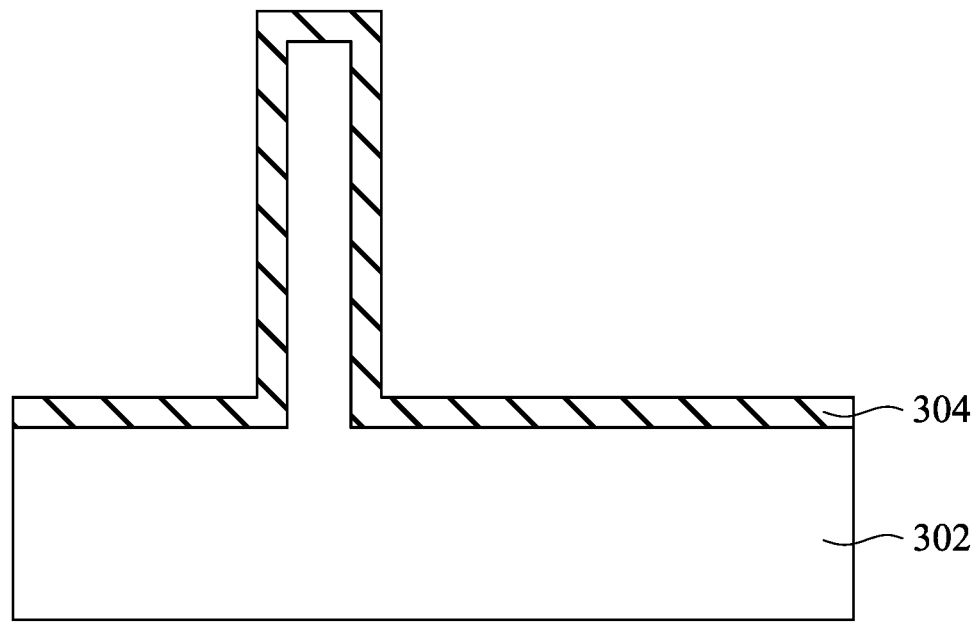

As shown in FIG. 4B, a first dielectric layer 304 is formed on the surface of the substrate 302 and on the fin 350. In some embodiments, the first dielectric layer 304 may surround the fin 350, with the first dielectric layer 304 covering side surfaces and an upper surface of the fin 350. In some embodiments, the first dielectric layer 304 is an oxide layer, such as silicon dioxide ($SiO_2$) or hafnium dioxide ($HfO_2$). In some embodiments, the first dielectric layer 304 may be a multi-layer structure such as a layered stack of $SiO_2$ and $HfO_2$. The first dielectric layer 304 may be formed by any suitable process, including, for example, deposition, anodization, thermal oxidation, or the like. In some embodiments, the first dielectric layer 308 is formed by a deposition process. In some embodiments, the thickness of the first dielectric layer 304 may be less than 10 nm. In some embodiments, the thickness of the first dielectric layer 304 is less than 4 nm.

Figure 4C:
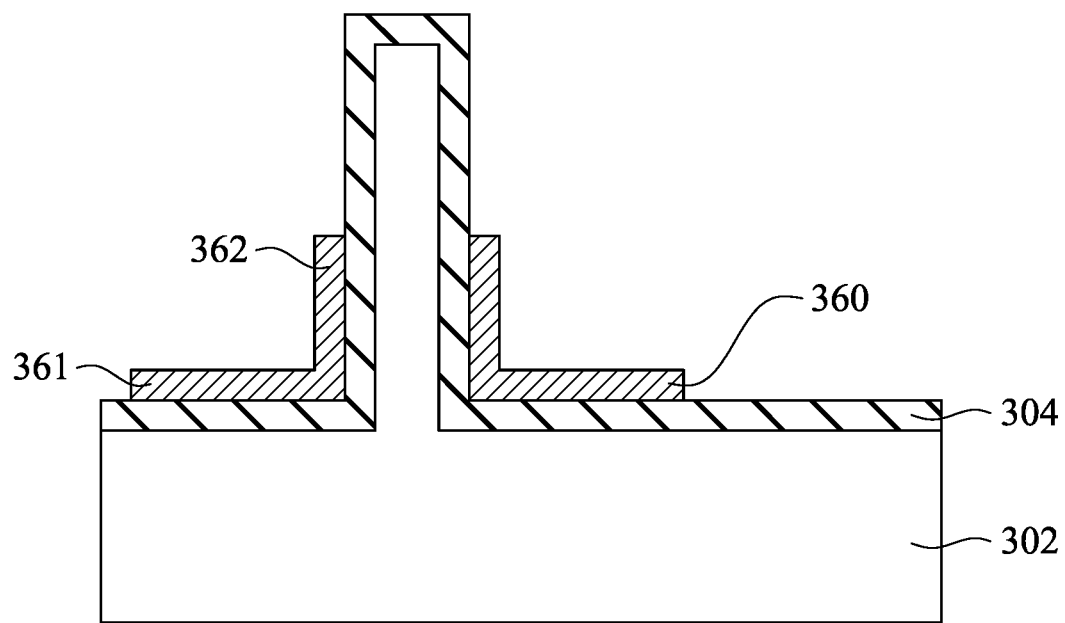

As shown in FIG. 4C, a metal layer 360 is formed on the first dielectric layer 304. The metal layer 360 includes a first portion 361 that extends in a first direction (e.g., a horizontal direction as shown in FIG. 3) and a second portion 362 that extends in a second direction (e.g., a vertical direction as shown in FIG. 3) that is transverse to the first direction. The metal layer 360 may be formed of any suitable metal. The metal layer 360 may be formed by depositing one or more of aluminum (Al), tantalum nitride (TaN), and titanium aluminide (TiAl) on the first dielectric layer 304 and patterning the deposited materials to form the metal layer 360. In some embodiments, the metal layer 360 may be formed as a multi-layer structure such as a layered stack of TaN, TiAl, and Al. Such a multi-layer structure may be formed by deposition of TaN, TiAl, and Al, in any order or sequence.

Figure 4D:
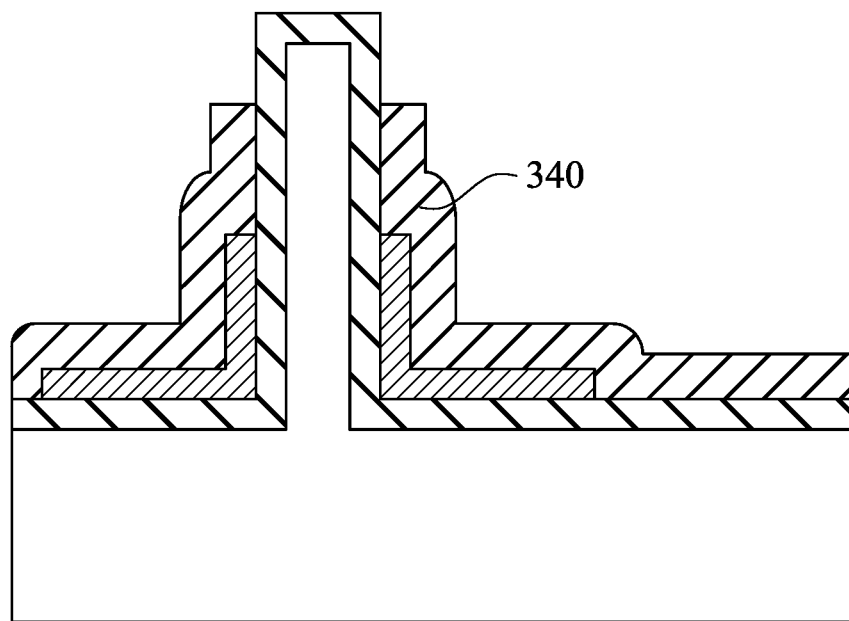

As shown in FIG. 4D, an isolation dielectric layer 340 is formed over the metal layer 360. In some embodiments, the isolation dielectric layer 340 is formed to extend over edges of the first portion 361 of the metal layer 360, e.g., over the left and right edges of the metal layer 360, as shown in FIG. 4D. The isolation dielectric layer 340 contacts the first dielectric layer 304 beyond the side edges of the first portion 361 of the metal layer 360. The isolation dielectric layer 340 extends in the second direction (e.g., the vertical direction shown in FIG. 3) over the second portion 362 of the metal layer 360, and may cover an upper surface of the second portion 362 of the metal layer 360 and contact the first dielectric layer 304 along a length of a portion of the fin 350 that extends along the second direction beyond an upper surface of the second portion 362 of the metal layer 360. The isolation dielectric layer 340 may be formed of any suitable dielectric material, and in some embodiments the isolation dielectric layer 340 may be an oxide.

In some embodiments, the isolation dielectric layer 340 is formed by deposition of a dielectric material. In some embodiments, the isolation dielectric layer 340 is formed by depositing a dielectric material over the fin 350, including over the upper surface of the fin 350, and then selectively removing portions of the deposited dielectric material to form the isolation dielectric layer 340. For example, portions of the deposited dielectric material may be removed from over the upper surface of the fin 350 and from an upper portion of the fin 350 so that the isolation dielectric layer 340 has an upper surface that is below the upper surface of the fin 350 as shown in FIG. 4D.

Figure 4E:
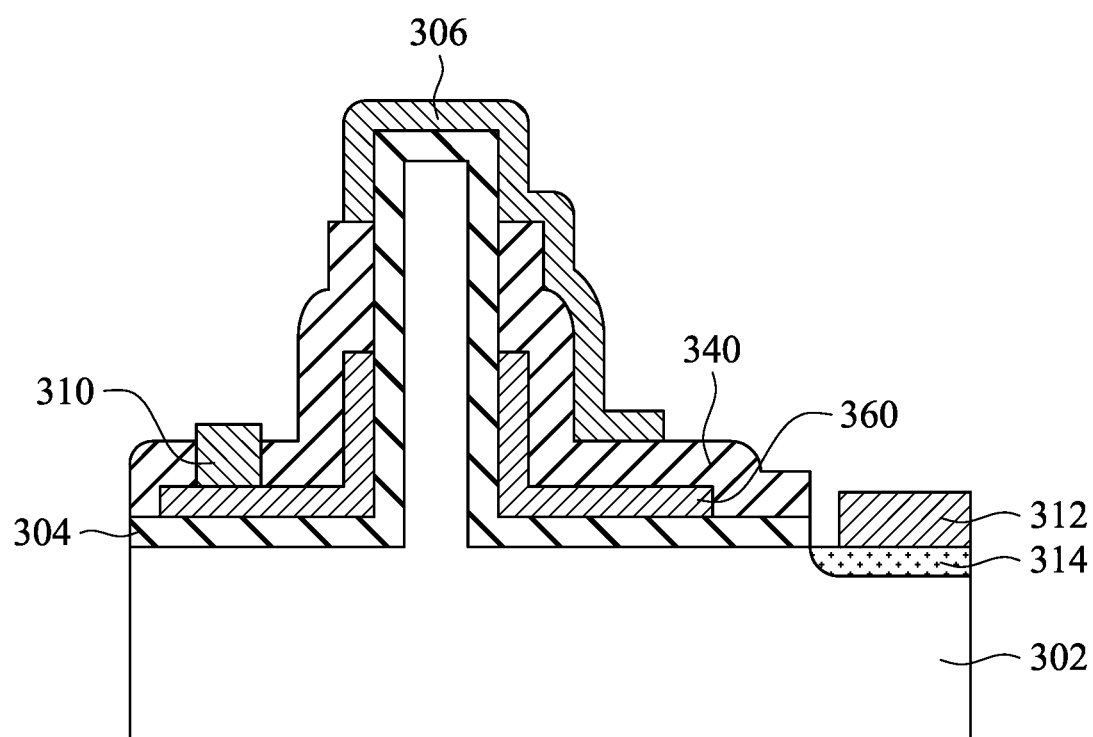

As shown in FIG. 4E, a doped region 314 is formed in the substrate 302, a gate electrode 310 is formed, a tunnel diode electrode 306 is formed, and a substrate electrode 312 is formed.

In some embodiments, the doped region 314 is formed by an implantation process in which a dopant species is implanted into the substrate 302. The implanted dopants may have a same conductivity type as the substrate 302. The doped region 314 has a higher concentration of the dopants (whether p-type or n-type) than the surrounding portions of the substrate 302. In some embodiments, the dopants may be implanted into the doped region 314 through the first dielectric layer 304 and/or the isolation dielectric layer 340, and portions of the first dielectric layer 304 and/or the isolation dielectric layer 340 may be selectively removed to expose a surface of the doped region 314. In other embodiments, the dopants may be implanted into the doped region 314 after portions of the first dielectric layer 304 and the isolation dielectric layer 340 have been removed to expose the surface of the substrate 302 into which the dopants are implanted.

The substrate electrode 312 is formed on the doped region 314. The substrate electrode 312 may be formed of any material suitable for use as an electrode, and may be, for example, a metal. The substrate electrode 312 may be formed, for example, by depositing one or more of aluminum (Al), tantalum nitride (TaN), and titanium aluminide (TiAl) on the doped region 314 and patterning the deposited materials to form the substrate electrode 312. In some embodiments, the substrate electrode 312 may be formed as a multi-layer structure such as a layered stack of TaN, TiAl, and Al. Such a multi-layer structure may be formed by deposition of TaN, TiAl, and Al, in any order or sequence.

The gate electrode 310 is formed on the metal layer 360. The gate electrode 310 may be formed of any material suitable for use as an electrode, and may be, for example, a metal. In some embodiments, a portion of the isolation dielectric layer 340 is removed (e.g., by an etching process or any other suitable technique) to expose part of the first portion 361 of the metal layer 360, and the gate electrode 310 is formed on and in contact with the exposed part of the first portion 361 of the metal layer 360. The gate electrode 310 may be formed, for example, by deposition. In some embodiments, the gate electrode 310 includes one or more of aluminum (Al), tantalum nitride (TaN), and titanium aluminide (TiAl). In some embodiments, the gate electrode 310 may be formed as a multi-layer structure such as a layered stack of TaN, TiAl, and Al. Such a multi-layer structure may be formed by deposition of TaN, TiAl, and Al, in any order or sequence. In some embodiments, the isolation dielectric layer 340 abuts side surfaces of the gate electrode 310.

The tunnel diode electrode 306 is formed on the first dielectric layer 304 over the upper surface of the fin 350. In some embodiments, the tunnel diode electrode 306 contacts the upper surface of the isolation dielectric layer 340 and extends along the second direction (e.g., the vertical direction shown in FIG. 3) and over the first dielectric layer 304 on the upper surface of the fin 350. The tunnel diode electrode 306 may be spaced apart from the metal layer 360 by the isolation dielectric 340.

The tunnel diode electrode 306 may be formed of any material suitable for use as an electrode, and may be, for example, a metal electrode. The tunnel diode electrode 306 may be formed, for example, by deposition. In some embodiments, the tunnel diode electrode 306 includes one or more of aluminum (Al), tantalum nitride (TaN), and titanium aluminide (TiAl). In some embodiments, the tunnel diode electrode 306 may be formed as a multi-layer structure such as a layered stack of TaN, TiAl, and Al. Such a multi-layer structure may be formed by deposition of TaN, TiAl, and Al, in any order or sequence.

In some embodiments, two or more of the substrate electrode 312, the gate electrode 310, and the tunnel diode electrode 306 may be formed of the same material or materials. In some embodiments, two or more of the substrate electrode 312, the gate electrode 310, and the tunnel diode electrode 306 may be formed by a same process, e.g., by deposition and patterning of the substrate electrode 312, the gate electrode 310, and the tunnel diode electrode 306.

FIGS. 5 through 14 are top plan views illustrating various layouts of gated MIS-tunnel diode devices in accordance with embodiments of the present disclosure. Each of the devices illustrated in FIGS. 4 through 14 operates in a similar manner as described herein with respect to the device 100 shown in FIG. 1 and the device 300 shown in FIG. 3. More particularly, the devices illustrated in FIGS. 5 through 14 have a negative transconductance property when a gate electrode is biased from an inversion region to a flat-band region. Each of the devices illustrated in FIGS. 5 through 14 includes a gate electrode and a tunnel diode electrode which are spaced apart from one another by a distance. In some embodiments, the distance between the gate electrode and the tunnel diode electrode is within a range from several micrometers to several angstroms, inclusive. In some embodiments, the distance between the gate electrode and the tunnel diode electrode is less than 10 µm. In some embodiments, the distance between the gate electrode and the tunnel diode electrode is less than 100 nm. Furthermore, each of the devices illustrated in FIGS. 5 through 14 may include any of the features described herein, including, for example, any of the features described herein with respect to the device 100 shown in FIG. 1 and/or the device 300 shown in FIG. 3.

In various embodiments of the devices shown in one or more of FIGS. 5 through 14, the tunnel diode electrode and the gate electrode may have dimensions (including, for example, width, length, and thickness dimensions) within a range from several hundreds of micrometers to several nanometers, inclusive.

Figure 5:
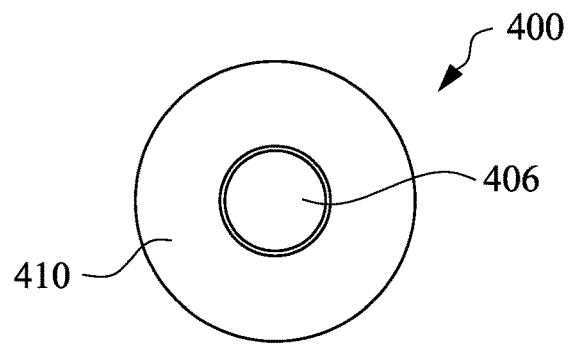
FIG. 5 is a top plan view illustrating a device having a gate electrode that laterally surrounds a tunnel diode electrode, in accordance with some embodiments.

FIG. 5 is a top plan view illustrating a device 400 which includes a tunnel diode electrode 406, and a gate electrode 410 that laterally surrounds the tunnel diode electrode 406. The tunnel diode electrode 406 may have a substantially circular shape in top plan view. The gate electrode 410 may have a substantially ring shape in top plan view.

The tunnel diode electrode 406 and the gate electrode 410 may be formed on a substrate, which may be substantially the same as the substrate 102 of the device 100 shown in FIG. 1. In some embodiments, the device 400 may include one or more of the features of the device 100 shown in FIG. 1. For example, in various embodiments, the device 400 may include the doped region 114, the tunnel diode dielectric layer 104 (which may be positioned between the substrate and the tunnel diode electrode 406), and the gate dielectric layer 108 (which may be positioned between the substrate and the gate electrode 410). In some embodiments, the device 400 includes a substrate electrode (not shown) which may be substantially the same as the substrate electrode 112 shown in FIG. 1 or the substrate electrode 312 shown in FIG. 3. The substrate electrode may be provided on a doped region and spaced apart from the gate electrode 410, with the gate electrode 410 positioned between the tunnel diode electrode 406 and the substrate electrode.

In some embodiments, the device 400 may have a vertical or fin structure and may include one or more of the features of the device 300 shown in FIG. 3. For example, the tunnel diode electrode 406 may be disposed over a semiconductor fin, while the gate electrode 410 may be disposed on a surface of the substrate.

Figure 6:
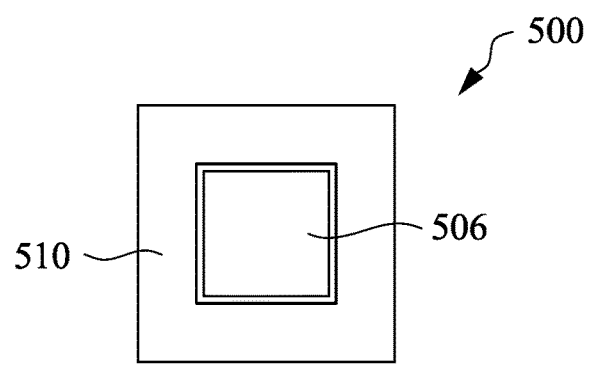
FIG. 6 is a top plan view illustrating a device having a gate electrode that laterally surrounds a tunnel diode electrode, in accordance with some embodiments.

FIG. 6 is a top plan view illustrating a device 500 which includes a tunnel diode electrode 506, and a gate electrode 510 that laterally surrounds the tunnel diode electrode 506. The device 500 shown in FIG. 6 is substantially the same as the device 400 shown in FIG. 5, except that in the device 500, the tunnel diode electrode 506 has a substantially rectangular shape in top plan view. The gate electrode 510 has a substantially rectangular inner perimeter in top plan view which is adjacent to, and spaced apart from, the tunnel diode electrode 506. An outer perimeter of the gate electrode 510 similarly has a substantially rectangular shape in top plan view.

Figure 7:
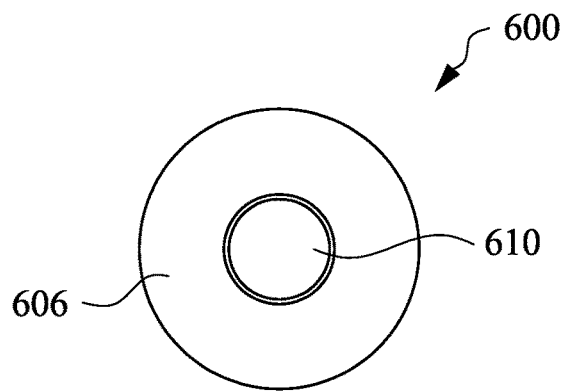
FIG. 7 is a top plan view illustrating a device having a tunnel diode electrode that laterally surrounds a gate electrode, in accordance with some embodiments.

FIG. 7 is a top plan view illustrating a device 600 which includes a gate electrode 610, and a tunnel diode electrode 606 that laterally surrounds the gate electrode 610. The device 600 shown in FIG. 7 is substantially the same as the device 400 shown in FIG. 5, except that the positions of the gate electrode 610 and the tunnel diode electrode 606 are reversed with respect to the gate electrode 410 and the tunnel diode electrode 406 of the device 400.

Figure 8:
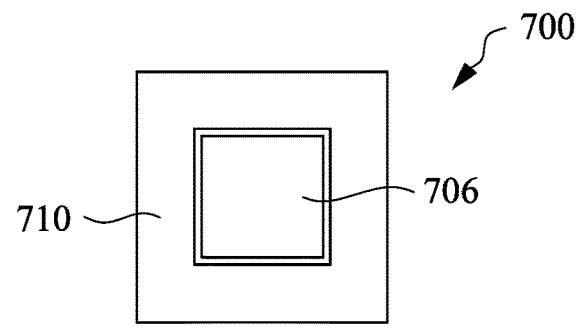
FIG. 8 is a top plan view illustrating a device having a tunnel diode electrode that laterally surrounds a gate electrode, in accordance with some embodiments.

FIG. 8 is a top plan view illustrating a device 700 which includes a gate electrode 710, and a tunnel diode electrode 706 that laterally surrounds the gate electrode 610. The device 700 shown in FIG. 6 is substantially the same as the device 500 shown in FIG. 5, except that the positions of the gate electrode 710 and the tunnel diode electrode 706 are reversed with respect to the gate electrode 510 and the tunnel diode electrode 506 of the device 500.

Figure 9:
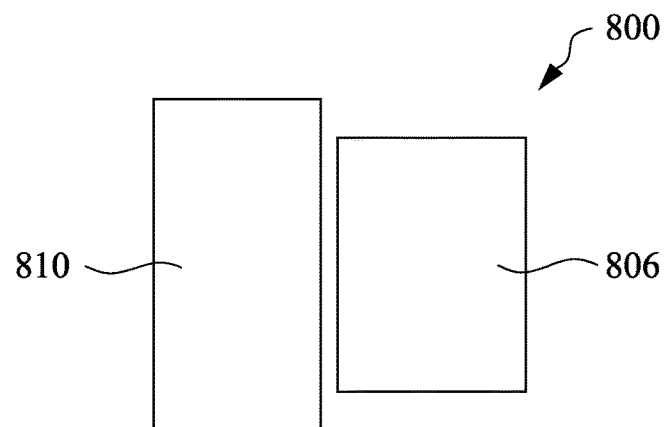
FIG. 9 is a top plan view illustrating a device having a gate electrode and a tunnel diode electrode provided in a parallel layout, in accordance with some embodiments.

FIG. 9 is a top plan view illustrating a device 800 which includes a gate electrode 810 and a tunnel diode electrode 806 provided in a parallel layout. The gate electrode 810 and the tunnel diode electrode 806 may have substantially rectangular shapes in top plan view, and may be spaced apart from one another as shown. In some embodiments, the size and shape of the gate electrode 810 and the tunnel diode electrode 806 may be different from each other.

Figure 10:
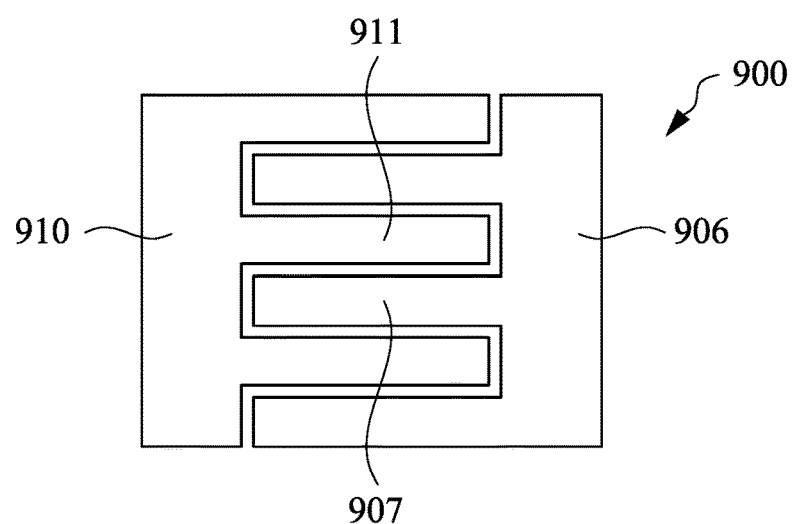
FIG. 10 is a top plan view illustrating a device having a gate electrode 910 and a tunnel diode electrode provided in a "fingers" layout, in accordance with some embodiments.

FIG. 10 is a top plan view illustrating a device 900 which includes a gate electrode 910 and a tunnel diode electrode 906 provided in a "fingers" layout. The gate electrode 910 includes a plurality of extending portions or fingers 911 that extend from a body of the gate electrode 910. Similarly, the tunnel diode electrode 906 includes a plurality of extending portions or fingers 907 that extend from a body of the tunnel diode electrode 906. The fingers 911 of the gate electrode 910 extend toward the body of the tunnel diode electrode 906, while the fingers 907 of the tunnel diode electrode 906 extend toward the body of the gate electrode 910. The fingers 911 of the gate electrode 910 and the fingers 907 of the tunnel diode electrode 906 are alternately arranged, in top plan view, between the body of the gate electrode 910 and the body of the tunnel diode electrode 906.

Figure 11:
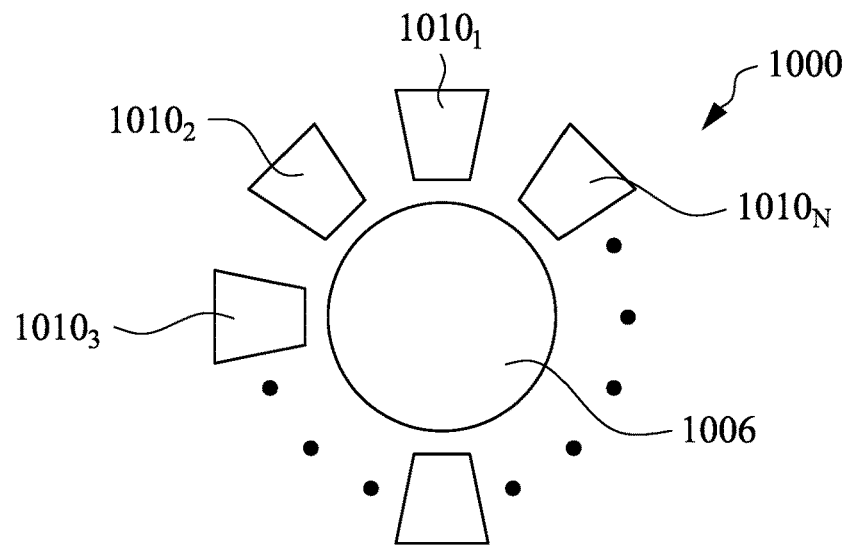
FIG. 11 is a top plan view illustrating a device having a multi-gate layout, in accordance with some embodiments.

FIG. 11 is a top plan view illustrating a device 1000 which has a multi-gate layout. More specifically, the device 1000 includes a tunnel diode electrode 1006, and a plurality of gate electrodes $1010_1$ through $1010_N$ that are provided around the tunnel diode electrode 1006 in top plan view. The tunnel diode electrode 1006 may have a substantially circular shape in top plan view, as shown; however, embodiments are not limited thereto. In some embodiments, the tunnel diode electrode 1006 may have any non-circular shape in top plan view, including, for example, a rectangular shape, square shape, polygonal shape, or any other shape.

The gate electrodes $1010_1$ through $1010_N$ may substantially surround the tunnel diode electrode 1006, with adjacent ones of the gate electrodes $1010_1$ through $1010_N$ being spaced apart from one another.

Figure 12:
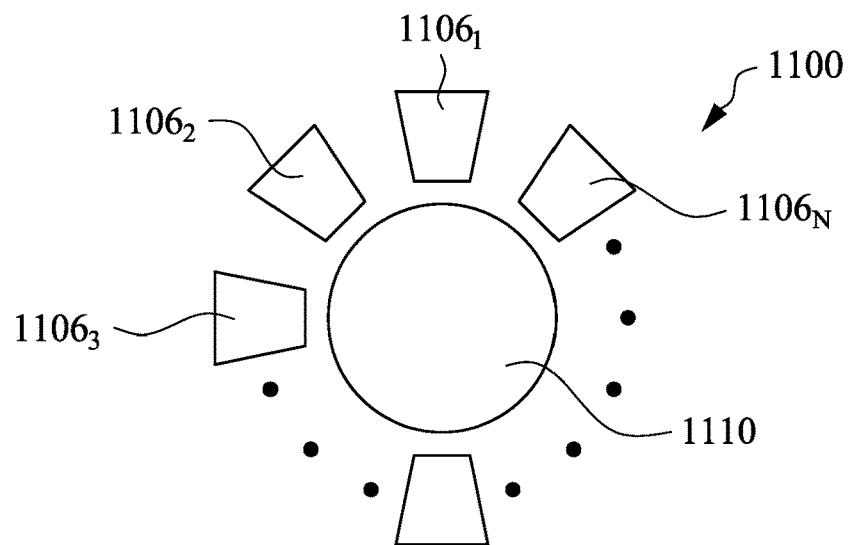
FIG. 12 is a top plan view illustrating a device having a multi-gate layout, in accordance with some embodiments.

FIG. 12 is a top plan view illustrating a device 1100 having a multi-gate layout. The device 1100 shown in FIG. 12 is substantially the same as the device 1000 shown in FIG. 11, except that the positions of the gate electrode and the tunnel diode electrode are reversed in the device 1100 with respect to the gate electrode and the tunnel diode electrode of the device 1000. More specifically, the device 1100 includes a gate electrode 1110 and a plurality of tunnel diode electrodes $1106_1$ through $1106_N$ that are provided around the gate electrode 1110 in top plan view. The gate electrode 1110 may have a substantially circular shape in top plan view, as shown; however, embodiments are not limited thereto. In some embodiments, the gate electrode 1110 may have any non-circular shape in top plan view, including, for example, a rectangular shape, square shape, polygonal shape, or any other shape.

The tunnel diode electrodes $1106_1$ through $1106_N$ may substantially surround the gate electrode 1110, with adjacent ones of the tunnel diode electrodes $1106_1$ through $1106_N$ being spaced apart from one another.

Figure 13:
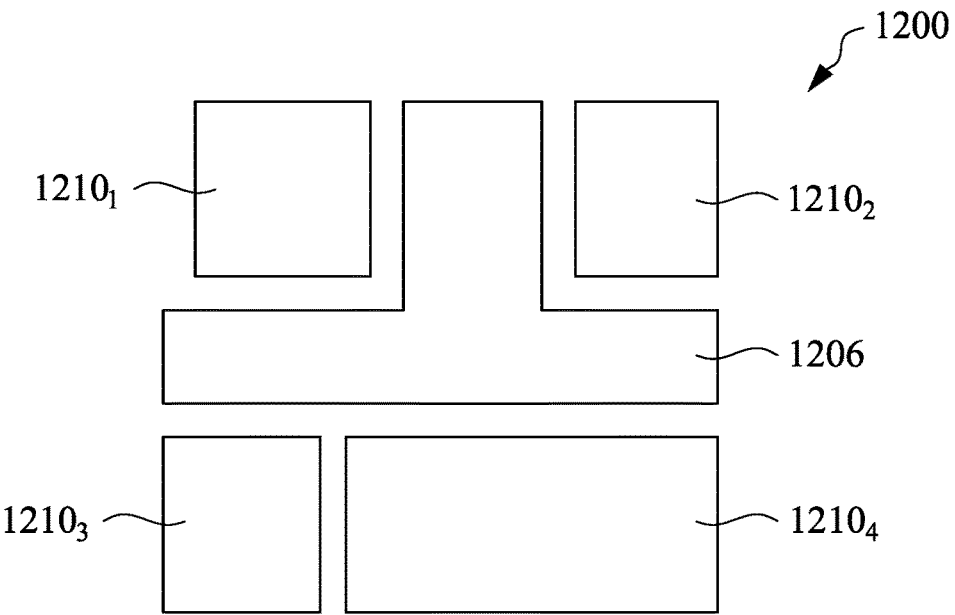
FIG. 13 is a top plan view illustrating a device having a multi-gate layout, in accordance with some embodiments.

FIG. 13 is a top plan view illustrating a device 1200 having a multi-gate layout. The device 1200 includes a tunnel diode electrode 1206 that includes a first portion which extends in a first direction, and a second portion that extends in a second direction that is transverse to the first direction. Gate electrodes $1210_1$ through $1210_4$ are adjacent to the tunnel diode electrode 1206 at various different positions. As shown in FIG. 13, the device 1200 may include four gate electrodes $1210_1$ through $1210_4$; however, embodiments are not limited thereto. Any number of gate electrodes may be included in the device 1200 and spaced apart from the tunnel diode electrode 1206. In some embodiments, the gate electrodes $1210_1$ through $1210_4$ have various different sizes and shapes.

Figure 14:
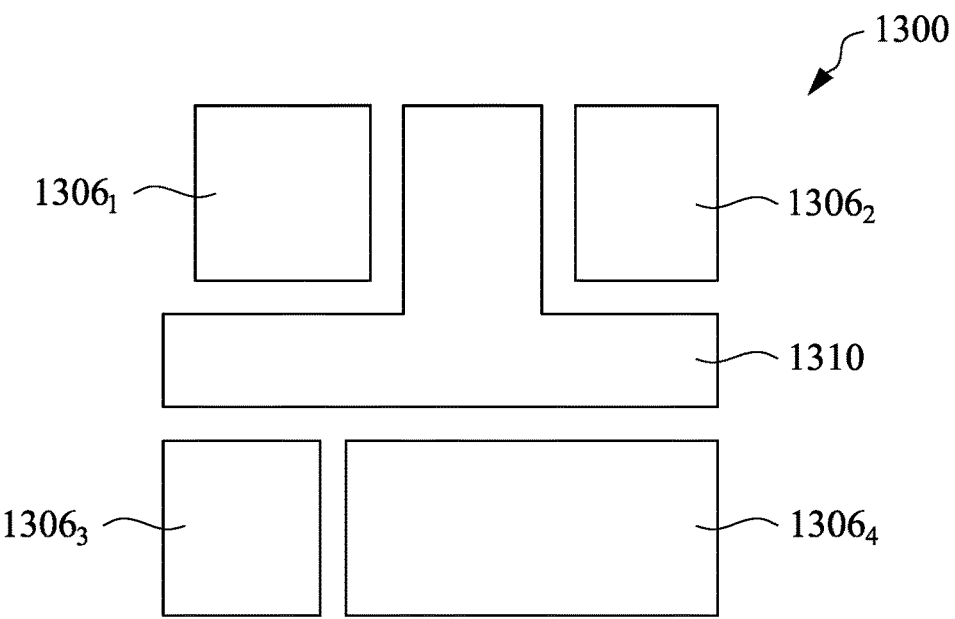
FIG. 14 is a top plan view illustrating a device having a multi-gate layout, in accordance with some embodiments.

FIG. 14 is a top plan view illustrating a device 1300 having a multi-gate structure. The device 1300 shown in FIG. 14 is substantially the same as the device 1200 shown in FIG. 13, except that the gate electrode and the tunnel diode electrode are reversed in the device 1300 with respect to the gate electrode and the tunnel diode electrode of the device 1200. More specifically, the device 1300 includes a gate electrode 1310 that includes a first portion which extends in a first direction, and a second portion that extends in a second direction that is transverse to the first direction. Tunnel diode electrodes $1306_1$ through $1306_4$ are adjacent to the gate electrode 1310 at various different positions. As shown in FIG. 14, the device 1300 may include four tunnel diode electrodes $1306_1$ through $1306_4$; however, embodiments are not limited thereto. Any number of tunnel diode electrodes may be included in the device 1300 and spaced apart from the gate electrode 1310.

The present disclosure provides, in various embodiments, gated-MIS tunnel diode devices that have a controllable negative transconductance behavior. The devices may include a tunnel diode electrode that is between a gate electrode and a substrate electrode. During operation, a voltage applied to the tunnel diode electrode causes majority charge carriers (e.g., holes) to tunnel through a tunnel diode dielectric layer, and the negative transconductance of the device is controllable by a voltage applied to the gate electrode. In some embodiments, in which the thickness of the tunnel diode dielectric layer is between about 2 nm to 4 nm, the peak-to-valley current ratio (PVCR) can be increased by about 6 orders of magnitude.

According to one embodiment, a device includes a substrate having a surface. A tunnel diode dielectric layer is disposed on the surface of the substrate, and a gate dielectric layer is disposed on the surface of the substrate adjacent to the tunnel diode dielectric layer. A tunnel diode electrode is disposed on the tunnel diode dielectric layer, and a gate electrode is disposed on the gate dielectric layer. A substrate electrode is disposed on the surface of the substrate, with the tunnel diode electrode positioned between the gate electrode and the substrate electrode.

According to another embodiment, a method is provided that includes forming a gate dielectric layer on a surface of a substrate. A tunnel diode dielectric layer is formed on the surface of the substrate adjacent to the gate dielectric layer. A gate electrode on is formed on the gate dielectric layer. A tunnel diode electrode is formed on the tunnel diode dielectric layer. A doped region is formed in the substrate, with the tunnel diode electrode positioned between the gate electrode and the doped region. A substrate electrode is formed on the doped region.

According to yet another embodiment, a device includes a substrate including a bulk region having a first concentration of dopants of a first conductivity type and a doped region having a second concentration of dopants of the first conductivity type, the second concentration being greater than the first concentration. The device includes a sensing tunnel diode and a control tunnel diode that is adjacent to the sensing tunnel diode. The sensing tunnel diode includes a tunnel oxide layer on the bulk region of the substrate and a tunnel diode electrode on the tunnel oxide layer. The control tunnel diode includes a gate oxide layer on the substrate and a gate electrode on the gate oxide layer. The device further includes a substrate electrode on the doped region of the substrate. The sensing tunnel diode is positioned between the control tunnel diode and the substrate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate;
a tunnel diode dielectric layer on the substrate;
a tunnel diode electrode on the tunnel diode dielectric layer;
a gate dielectric layer on the substrate adjacent to the tunnel diode dielectric layer;
a gate electrode on the gate dielectric layer; and
a substrate electrode on the substrate, the tunnel diode electrode positioned between the gate electrode and the substrate electrode,
wherein the tunnel diode electrode laterally surrounds a periphery of the gate electrode.

2. The device of claim 1 wherein the substrate includes a doped region, wherein the substrate electrode contacts the doped region of the substrate.

3. The device of claim 1 wherein the tunnel diode dielectric layer is a multi-layer structure including a silicon dioxide ($SiO_2$) layer and a hafnium dioxide ($HfO_2$) layer.

4. The device of claim 1 wherein the gate dielectric layer is a multi-layer structure including a silicon dioxide ($SiO_2$) layer and a hafnium dioxide ($HfO_2$) layer.

5. The device of claim 1 wherein the gate electrode has a substantially circular shape, and the tunnel diode electrode completely laterally surrounds the periphery of the gate electrode.

6. The device of claim 1 wherein the gate electrode has a substantially rectangular shape, and the tunnel diode electrode completely laterally surrounds the periphery of the gate electrode.

7. The device of claim 1 wherein the tunnel diode dielectric layer has a thickness that is equal to or less than 4 nm.

8. The device of claim 1 wherein the gate dielectric layer has a thickness that is greater than a thickness of the tunnel diode dielectric layer, and the gate electrode is different than the tunnel diode electrode.

9. The device of claim 1, further comprising:
a fin on the substrate;
a metal layer surrounding at least a portion of the fin and between the gate electrode and the gate dielectric layer; and
an isolation dielectric layer between the tunnel diode electrode and the metal layer,
wherein the tunnel diode dielectric layer is disposed between the fin and the tunnel diode electrode, and the gate electrode contacts the metal layer.

10. The device of claim 9 wherein the tunnel diode dielectric layer and the gate dielectric layer are formed of a same layer of dielectric material.

11. The device of claim 1 wherein the gate electrode is spaced apart from the tunnel diode electrode by a distance equal to or less than 100 nm.

12. The device of claim 1 wherein the tunnel diode electrode includes a plurality of fingers which extend from a body of the tunnel diode electrode toward a body of the gate electrode, and the gate electrode includes a plurality of fingers which extend from the body of the gate electrode toward the body of the tunnel diode electrode, wherein the tunnel diode electrode fingers at least partially surround a periphery of the gate electrode fingers.

13. A device, comprising:
a substrate having a surface;
a tunnel diode dielectric layer on the surface of the substrate;
a tunnel diode electrode on the tunnel diode dielectric layer;
a gate dielectric layer on the surface of the substrate adjacent to the tunnel diode dielectric layer; and
a plurality of gate electrodes on the gate dielectric layer and positioned about a periphery of the tunnel diode electrode.

14. The device of claim 13 wherein the tunnel diode has a substantially circular shape, and the plurality of gate electrodes are spaced apart from one another adjacent to the periphery of the tunnel diode.

15. The device of claim 13 wherein the tunnel diode includes a first portion extending along a first direction on the surface of the substrate and a second portion extending laterally outward from the first portion along a second direction that is transverse to the first direction, and the plurality of gate electrodes includes first and second gate electrodes positioned adjacent to opposite sides of the second portion of the tunnel diode.

16. The device of claim 13 wherein the gate dielectric layer has a thickness that is greater than a thickness of the tunnel diode dielectric layer, and the plurality of gate electrodes are different than the tunnel diode electrode.

17. The device of claim 13 wherein at least one of the tunnel diode electrode or the plurality of gate electrodes includes a multi-layer stack including tantalum nitride (TaN), titanium aluminide (TiAl), and aluminum (Al).

18. A method, comprising:
depositing a dielectric layer on a substrate;
forming a gate dielectric layer from the dielectric layer on the substrate;
forming a tunnel diode dielectric layer from the dielectric layer on the substrate adjacent to the gate dielectric layer;
forming a gate electrode on the gate dielectric layer; and
forming a tunnel diode electrode on the tunnel diode dielectric layer, the tunnel diode electrode laterally surrounding a periphery of the gate electrode.

19. The method of claim 18, further comprising:
forming a doped region in the substrate, the tunnel diode electrode positioned between the gate electrode and the doped region; and
forming a substrate electrode on the doped region.

20. The method of claim 18 wherein the forming the gate dielectric layer includes forming the gate dielectric layer to have a first thickness, and wherein the forming the tunnel diode dielectric layer includes forming the tunnel diode dielectric layer to have a second thickness that is less than the first thickness.

* * * * *